(12) United States Patent
Kurimoto et al.

(10) Patent No.: US 10,879,425 B2
(45) Date of Patent: Dec. 29, 2020

(54) LIGHT-EMITTING DEVICE

(71) Applicant: NICHIA CORPORATION, Anan (JP)

(72) Inventors: Takeo Kurimoto, Anan (JP); Yuki Miyaura, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/436,540

(22) Filed: Jun. 10, 2019

(65) Prior Publication Data

US 2019/0393383 A1 Dec. 26, 2019

(30) Foreign Application Priority Data

Jun. 21, 2018 (JP) ................... 2018-117861

(51) Int. Cl.

| | | |
|---|---|---|
| *H01L 33/48* | (2010.01) | |
| *H01L 33/62* | (2010.01) | |
| *H01L 33/60* | (2010.01) | |
| *H01L 33/50* | (2010.01) | |
| *H01L 25/16* | (2006.01) | |

(Continued)

(52) U.S. Cl.
CPC ............ *H01L 33/48* (2013.01); *H01L 33/486* (2013.01); *H01L 33/60* (2013.01); *H01L 33/62* (2013.01); *H01L 25/167* (2013.01); *H01L 33/32* (2013.01); *H01L 33/507* (2013.01); *H01L 33/54* (2013.01); *H01L 2933/0091* (2013.01)

(58) Field of Classification Search
CPC ............... H01L 25/0753; H01L 25/167; H01L 2933/0091; H01L 33/32; H01L 33/44; H01L 33/48; H01L 33/486; H01L 33/507; H01L 33/54; H01L 33/58; H01L 33/60; H01L 33/62
See application file for complete search history.

(56) References Cited

U.S. PATENT DOCUMENTS

| | | |
|---|---|---|
| 2003/0025450 A1 | 2/2003 | Katayama et al. |
| 2012/0235169 A1* | 9/2012 | Seko ............... H01L 33/60 257/88 |
| 2012/0273811 A1 | 11/2012 | Krauter et al. |

(Continued)

FOREIGN PATENT DOCUMENTS

| | | |
|---|---|---|
| DE | 102016113514 A1 | 1/2018 |
| JP | 2002223005 A | 8/2002 |

(Continued)

*Primary Examiner* — Julio J Maldonado
*Assistant Examiner* — Mohammad A Rahman
(74) *Attorney, Agent, or Firm* — Global IP Counselors, LLP

(57) ABSTRACT

A light-emitting device includes a package, at least one light-emitting element and a light-absorbing member. The package defines a recess having an opening at a light extraction surface of the package. A part of the recess is defined by an upward-facing surface of the package. The light-emitting element is mounted on the upward-facing surface of the package. The light-absorbing member is disposed in the recess, spaced apart from the light-emitting element, and having an exposed surface facing upward toward the light extraction surface, the exposed surface being exposed from the upward-facing surface of the package with the exposed surface and the upward-facing surface of the package being on the same plane.

20 Claims, 3 Drawing Sheets

(51) Int. Cl.
    *H01L 33/54*     (2010.01)
    *H01L 33/32*     (2010.01)

(56) References Cited

U.S. PATENT DOCUMENTS

| | | | |
|---|---|---|---|
| 2013/0200411 A1* | 8/2013 | O'Brien | H01L 33/60 |
| | | | 257/98 |
| 2017/0092816 A1* | 3/2017 | Ikeda | H01L 33/486 |
| 2017/0213945 A1* | 7/2017 | Yamashita | H01L 33/62 |

FOREIGN PATENT DOCUMENTS

| | | | | |
|---|---|---|---|---|
| JP | 2003046138 A | | 2/2003 | |
| JP | 2004200410 A | | 7/2004 | |
| JP | 2004207363 A | | 7/2004 | |
| JP | 2004207621 A | | 7/2004 | |
| JP | 2004228531 A | | 8/2004 | |
| JP | 2004343059 A | | 12/2004 | |
| JP | 2010505254 A | | 2/2010 | |
| JP | 2011199219 A | | 10/2011 | |
| JP | 2012059939 A | | 3/2012 | |
| JP | 2013512556 A | | 4/2013 | |
| JP | 2013131519 A | | 7/2013 | |
| JP | 2013183129 A | | 9/2013 | |
| JP | 2015012203 | * | 1/2015 | H01L 33/48 |
| JP | 2015012203 A | | 1/2015 | |

* cited by examiner

LIGHT-EMITTING DEVICE

CROSS REFERENCE TO RELATED APPLICATIONS

This application claims priority to Japanese Patent Application No. 2018-117861, filed on Jun. 21, 2018. The entire disclosure of Japanese Patent Application No. 2018-117861 is hereby incorporated herein by reference.

BACKGROUND OF THE INVENTION

1. Field of the Invention

The present disclosure relates to a light-emitting device.

2. Description of Related Art

Light-emitting devices having a black light-absorbing layer on a mounting surface of LED chips have been proposed (see Japanese Unexamined Patent Application Publication Nos. 2003-046138 and 2015-012203). In these light-emitting devices, an influence of reflection of external light, such as sunlight or indoor light, entering the light-emitting devices is reduced to improve contrast between an LED chip that is turned on and an LED chip that is turned off.

SUMMARY OF THE INVENTION

However, with the black light-absorbing layer disposed on a light emission surface, light extraction efficiency may be reduced. One object of the present disclosure is to provide a light-emitting device that is unlikely to be influenced by reflection of an external light without reducing light extraction efficiency.

A light-emitting device according to one aspect includes a package, at least one light-emitting element and a light-absorbing member. The package defines a recess having an opening at a light extraction surface of the package. A part of the recess is defined by an upward-facing surface of the package. The light-emitting element is mounted on the upward-facing surface of the package. The light-absorbing member is disposed in the recess, spaced apart from the light-emitting element, and having an exposed surface facing upward toward the light extraction surface, the exposed surface being exposed from the upward-facing surface of the package with the exposed surface and the upward-facing surface of the package being on the same plane.

A light-emitting device according to another aspect includes a package, at least one light-emitting element, and a light absorbing member. The package defines a recess having an opening at a light extraction surface of the package. A part of the recess is defined by an upward-facing surface of the package. The light-emitting element is mounted on the upward-facing surface of the package. The light-absorbing member is disposed in the recess, spaced apart from the light-emitting element, and having an exposed surface facing upward toward the light extraction surface, the exposed surface being recessed with respect to the upward-facing surface of the package.

A light-emitting device according to another aspect includes a package, at least one light-emitting element and a light-absorbing member. The package defines a recess having an opening at a light extraction surface of the package. The recess is defined by an upward-facing surface and a lateral wall, with the lateral wall including a step portion and/or a groove between the opening and the upward-facing surface. At least one light-emitting element is mounted on the upward-facing surface of the package. The light-absorbing member is disposed in the recess on the step portion and/or in the groove defined by the lateral wall. The light-absorbing member is spaced apart from the light-emitting element, and having an exposed surface exposed from the package.

According to one embodiment of the present disclosure, a light-emitting device that is unlikely to be influenced by reflection of external light without reducing light extraction efficiency can be obtained.

BRIEF DESCRIPTION OF TOE DRAWINGS

DETAILED DESCRIPTION OF EMBODIMENTS

Figure 1A:
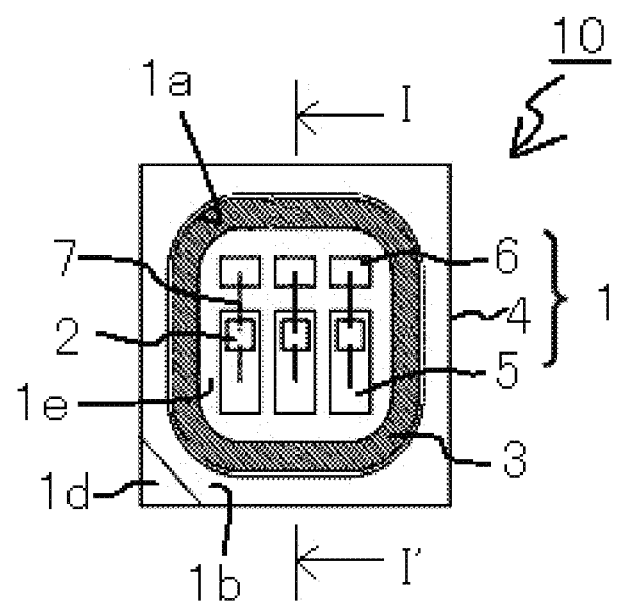
FIG. 1A is a schematic plan view of a light-emitting device according to one embodiment of the present disclosure.

The embodiments described below are intended to embody the technical concept of the present disclosure and are not intended to limit the present invention to the embodiments below. The sizes, positional relationships, and the like of members shown in the drawings may be exaggerated for clarity of descriptions. Furthermore, in the following description, the same term or reference numeral generally represents the same member or a member made of the same material, and its duplicative descriptions may be appropriately omitted.

First Embodiment

Figure 1B:
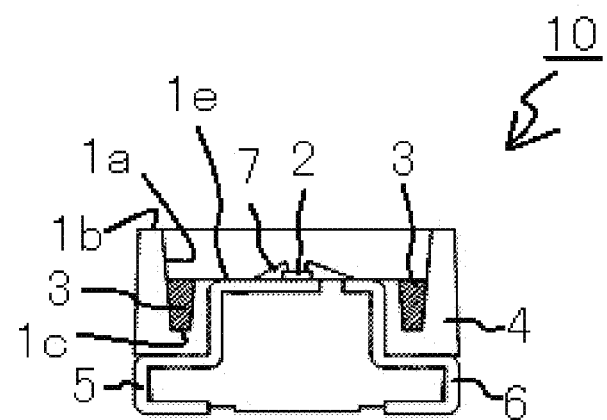
FIG. 1B is a schematic sectional view taken along the line I-I' in FIG. 1A.

A light-emitting device 10 according to a first embodiment of the present disclosure includes, as shown in FIGS. 1A and 1B, a package 1 defining a recess 1a having an opening at a light extraction surface of the light-emitting device 10, at least one light-emitting element 2 mounted on an upward-facing surface 1e defining the recess 1a, and a light-absorbing member 3 disposed in the recess 1a, spaced apart from the light-emitting element 2, and having an exposed surface facing upward toward the light extraction surface.

With the light-absorbing member 3 having the exposed surface facing upward toward the light extraction surface, in the case where, for example, the light-emitting device is used for a display device, the light-emitting device is unlikely to be influenced by reflection of external light when viewed from above the light extraction surface.

Package 1

The package 1 includes lead electrodes 5 and 6 and a resin part 4. The package 1 can have various shapes in a plan view such as a circular shape, an elliptic shape, or a polygonal shape such as a quadrilateral shape or a hexagonal shape, and preferably has a quadrilateral shape, in a plan view. The package 1 can have substantially a prismatic or columnar outer shape with a base having one of the shapes described above. A portion of a corner of the outer shape may be rounded. The rounded corner may serve as a mark 1d for identifying polarity of the light-emitting device 10.

The resin part 4 of the package 1 includes the recess 1a having the opening at an upper surface 1b, which is the light extraction surface, of the light-emitting device 10.

The opening can have, for example, a circular shape, an elliptic shape, a polygonal shape such as a quadrilateral shape or a hexagonal shape, or a polygonal shape with rounded corners, in a top view. The recess 1a is defined by an inner lateral surface inclined to be widened upward such that light laterally emitted from the light-emitting element 2 is reflected upward, that is, reflected in a light-extracting direction. The inclined inner lateral surface may include portions inclined at different angles. The inner lateral surface defining the recess 1a may have one or more stepped portions. The "step portion" as used herein refers to a portion that divides the inner lateral surface of the recess in a height direction and is disposed parallel to or substantially parallel to the light extraction surface and/or the lower surface of the package. The expression "substantially parallel" encompasses inclination at an angle of ±10 degrees with respect to the light extraction surface.

A thermosetting resin and/or a thermoplastic resin or the like can be used as a resin material for the resin part 4. Examples of the thermosetting resin include silicone resins, silicone modified resins, silicone hybrid resins, epoxy resins, epoxy modified resins, urea resins, diallyl phthalate resins, phenolic resins, unsaturated polyester resins, and hybrid resins each containing least one or more types of these resins. Examples of the thermoplastic resin may include polycarbonate resins, acrylic resins, polymethylpentene resins, polynorbomene resins, polyamide resins, polyphthalamide resins, polyester resins, liquid crystal resins, polyphenylene ether resins, aromatic polyamide resins, and hybrid resins each containing one or more types of these resins. Among these, resin materials having good heat and light resistances, such as polyester resins such as polycyclohexylenedimethylene terephthalate (PCT) resins, aromatic polyamide resins, epoxy resins, unsaturated polyester resins, silicone resins, and silicone hybrid resins, are preferable.

The resin part 4 may include fillers such as a light-reflecting substance in a light-transmissive resin. With this structure, the resin part 4 can function as a light-reflective member in the recess 1a to reflect light emitted from the light-emitting element 2 and to efficiently emit upward.

For the light-reflecting substance contained in the resin part 4, a material having a refractive index greatly different from a refractive index of the resin material described above.

Examples of the light-reflecting substances include titanium oxide, silicon oxide, zirconium oxide, potassium titanate, aluminum oxide, zinc oxide, aluminum nitride, boron nitride, and mullite. The resin part 4 can contain the light-reflecting substance at a ratio, for example, equal to or less than a range of 20 wt % to 80 wt % of the weight of the resin.

The lead electrodes 5 and 6 are a plurality of electrodes each having a corresponding one of positive and negative polarities, and each of the lead electrodes 5 and 6 includes a portion embedded in the resin part 4. A portion of an upper surface of each of lead electrodes 5 and 6 is exposed at the upward-facing surface of the recess 1a and constitutes the upward-facing surface 1e of the recess 1a.
A single pair of lead electrodes 5 and 6 may be disposed, or two or more pairs of the lead electrodes 5 and 6 may be disposed. The light-emitting element 2 is mounted on the upper surface of the lead electrode 5 and is electrically connected to the lead electrodes 5 and 6 via an electrically-conductive member such as a wire 7. Alternatively, each light-emitting element 2 may be flip-chip mounted across corresponding ones of the lead electrodes 5 and 6.

Other portions of the lead electrodes 5 and 6 exposed from the resin part 4 may be used as external electrodes of the light-emitting device 10 to be connected to external components. Accordingly, with a lower surface, opposite to the bottom surface 1e, of the light-emitting device 10 serving as a mounting surface of the light-emitting device 10, the portions of the lead electrodes 5 and 6 exposed from the resin part 4 at the lower surface of the light-emitting device 10 are bonded to the mounting substrate via an electrically-conductive bonding member such as solder.

The lead electrodes 5 and 6 are formed using a plate-like metal. The lead electrodes 5 and 6 may have a uniform thickness or a thickness partially increased or reduced. Any appropriate material may be used for the lead electrodes 5 and 6, but a material having a relatively large thermal conductivity is preferably used for the lead electrodes 5 and 6. With such a material, heat generated in the light-emitting element 2 can be efficiently dissipated to the outside via the lead electrodes 5 and 6. For the material constituting the lead electrodes 5 and 6, for example, a material having a thermal conductivity of approximately 200 W/m·k or more, a material having a relatively large mechanical strength, or a material that can be easily press-punched, etched, or the like. Specific examples of such a material include metals such as copper, aluminum, gold, silver, tungsten, iron, and nickel, and alloys such as iron-nickel alloys and phosphor bronze. For efficiently extracting light from the light-emitting elements 2 that are to be mounted, the upper surfaces of the lead electrodes 5 and 6 exposed at the upward-facing surface 1e of the recess 1a are preferably plated with a good reflective material such as Ag.

The lead electrodes 5 and 6 are preferably exposed at an external surface of the package 1. In this case, the lower surface and/or lateral surfaces of each of the lead electrodes 5 and 6 may be exposed from the resin part 4 of the package 1 while the lead electrodes 5 and 6 are not bent, or the lead electrodes 5 and 6 may be exposed at corresponding lateral surfaces and/or the lower surface of the package 1 while the lead electrodes 5 and 6 are bent one or more times in the resin part 4 such that a portion of the resin part 4 are surrounded by or located between the lead electrodes 5 and 6, as shown in FIG. 1B. In other words, the lead electrodes 5 and 6 each includes at least one bent portion at least partially covered by the resin part 4 in the package. For example, as shown in FIG. 1B, the lead electrodes may have a shape such that, in the resin part 4, the lead electrodes are bent downward relative to the upward-facing surface 1e of the recess 1a toward the lower surface of the package 1, then bent parallel to or substantially parallel to the upward-facing surface 1e of the recess 1a, then exposed, bent downward along the lateral surfaces of the resin part 4, and then bent along the lower surfaces of the package 1. The term "substantially parallel" as used herein allows an inclination in a range of ±10 degrees. As described above, with the one or more bends of the lead electrodes 5 and 6 relative to the upward-facing surface of the recess 1a downward of the package and/or toward an outer lateral surface of the package, the lead electrodes 5 and 6 can be in contact with the resin part 4 at a large contact surface area. With this configuration, detachment between the resin part 4 and the lead electrodes 5 and 6 can be effectively prevented. Also, bends of the lead electrodes can increase distance between a portion of each of the lead electrodes 5 and 6 exposed on the upward-facing surface 1e and a portion of each of the lead electrodes 5 and 6 exposed from the external surface of the resin part 4. With this configuration, entry of moisture and the like from outside can be reduced.

The package 1 shown in FIGS. 1A and 1B has, for example, a substantially rectangular parallelepiped shape with an upper surface having rectangular shape of 3 mm by 3 mm and lateral surfaces with a height of 2.5 mm. The lead electrodes 5 and 6 are made of plate-shaped metal plates made of copper. A portion of each of the metal plates made of copper exposed at the upward-facing surface 1e of the recess 1a is plated with Ag. In the resin part 4, the lead electrodes 5 and 6 are bent downward relative to the upward-facing surface 1e of the recess 1a toward the lower surface of the package 1, then bent parallel to or substantially parallel to the upward-facing surface of the recess 1a, and bent along the outer lateral surfaces and the lower surface of the package 1. The resin part 4 is made of polyamide resin containing titanium oxide, and forms the recess 1a defined by a lateral wall inclined at 98 degrees with respect to the upward-facing surface 1e.

Light-Emitting Element 2

For the light-emitting element 2, a semiconductor light-emitting element such as a light-emitting diode element may be used. For example, the light-emitting element 2 is preferably a light-emitting element of a nitride semiconductor $(In_xAl_yGa_{1-x-y}N, 0 \leq x, 0 \leq y, x+y \leq 1)$ to emit light particularly in ultraviolet to visible range. A single light-emitting element 2 or two or more light-emitting elements 2 may be mounted in a light-emitting device. In this case, the light-emitting elements 2 may emit light having the same wavelength or may emit light having different wavelengths. For example, three light-emitting elements including a blue light-emitting element to emit blue light, a green light-emitting element to emit green light, and a red light-emitting element to emit red light, may be mounted in the light-emitting device. Such a plurality of light-emitting elements can be connected in series and/or in parallel.

Each light-emitting element may be connected with the lead electrodes 5 and 6 via a wire 7 and the like, or may be connected to the lead electrodes by flip-chip mounting across the lead electrodes 5 and 6. In the case of having a plurality of light-emitting elements, for connection of each of the plurality of light-emitting elements, the connection methods as described above may be employed in combination.

Also, in addition to the light-emitting element 2, a protective element such as a Zener diode may be mounted on the upper surface of the lead electrodes 5 and 6. In the case where the light-emitting device includes a plurality of light-emitting elements and a plurality of pairs of leads for driving each of the plurality of the light-emitting elements, a protection element may be disposed on each pair of leads.

In FIGS. 1A and 1B, three light-emitting elements 2 in total are disposed on three pairs of the lead electrodes 5 that are exposed at the upward-facing surface 1e of the recess 1a of the package 1 such that each of the three light-emitting elements 2 is disposed on a respective pair of the three pairs of the lead electrodes 5.

Light-Absorbing Member 3

The light-absorbing member 3 is disposed in the recess 1a of the package 1. The light-absorbing member 3 is disposed in the recess 1a, spaced apart from the light-emitting element 2, with an exposed surface lacing upward toward a light extraction surface of the light-emitting device. In other words, the light-absorbing member 3 is disposed in the recess 1a to cover a portion of an inner surface of the recess 1a such that the exposed surface of the light-absorbing member 3 is located at a portion on which a primary light emitted from the light-emitting element 2 is not incident or not easily incident, that is, at a position that allows for preventing or reducing absorption of the primary light emitted from the light-emitting element 2 by the light-absorbing member 3. The expression "an exposed surface of the light-absorbing member 3" as used herein refers to a surface of the light-absorbing member 3 exposed from the resin part 4 at the recess 1a. The expression "having an exposed surface facing upward toward the light extraction surface" as used herein refers to that the light-absorbing member 3 has the exposed surface that is parallel to or substantially parallel to the upper surface 1b, which is the light extraction surface of the light-emitting device, and/or the upward-facing surface 1e of the package 1. The expression "substantially parallel" includes a surface inclined at an angle in a range of ±10 degrees with respect to the upper surface 1b. The inclination angle is preferably within a range of ±5 degrees, and more preferably within a range of ±3 degrees with respect to the upper surface 1b. The light-absorbing member 3 may have a single exposed surface in a single package 1, or may have two or more exposed surfaces in a single package 1. Also, the exposed surface may be arranged at different angles with respect to the upper surface 1b. In particular, the exposed surface is preferably located only at the upward-facing surface 1e of the recess 1a of the package 1, or in the case where the recess of the package has a step portion or a groove in the lateral surfaces, the exposed surface is preferably located only at the step portion or the groove.

As described above, with the light-absorbing member disposed in the recess 1a of the package 1, spaced apart from the light-emitting element 2, and having the exposed surface facing upward toward the light extraction surface, influence of reflection of external light to the light-emitting device when viewed from above the light extraction surface can be effectively-reduced, so that contrast can be improved. Such an effect is particularly useful for use in display units.

Figure 1C:
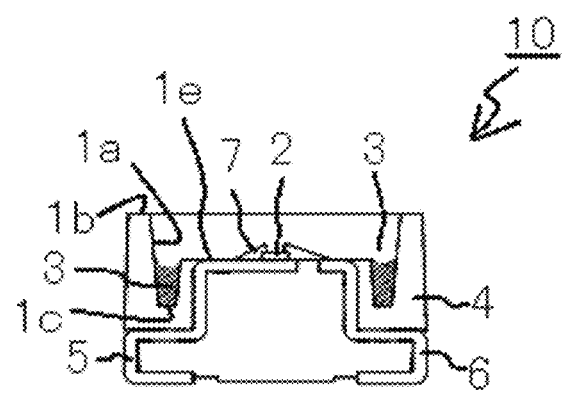
FIG. 1C is a schematic sectional view of a variation of the light-emitting device according to one embodiment.

More specifically, as shown in FIGS. 1A and 1B, the light-absorbing member 3 is preferably disposed such that the exposed surface is located on the same plane as a mounting surface of the light-emitting element 2 at the upward-facing surface 1e of the recess 1a, that is, the upward-facing surface 1e of the recess 1a is substantially flush with the exposed surface of the light-absorbing member 3. Further, the light-absorbing member 3 is preferably spaced apart from the light-emitting element 2 and to surround the outer periphery of the light-emitting element 2 in the plan view. In other words, it is preferable that the package 1 includes a depressed portion 1c along an outer periphery of the recess 1a or adjacent to the lateral surfaces defining the recess 1a, and the light-absorbing member 3 be disposed in the depressed portion 1c. Alternatively, the exposed surface of the light-absorbing member 3 may have a shape recessed with respect to the light extraction surface, and may be disposed in the depressed portion 1c. As shown in FIG. 1C, the exposed surface of the light-absorbing member 3 may be recessed downward with respect to the upward-facing surface 1e of the recess 1a.

When viewed from above the light extraction surface, the light-absorbing member 3 is preferably disposed to surround the outer periphery of the light-emitting element 2 with a width that is approximately the same as or in a range of ±50% of a length of a side of the light-emitting element 2 at the upward-facing surface 1e of the recess 1a. In another view, the light-absorbing member 3 preferably has a planar area of 15% to 50% of the total planar area of the light-emitting device and 45% to 400% of the planar area of the upward-facing surface 1e of the recess 1a when viewed from the light extraction surface. Alternatively, the width preferably is in a range of 150 μm to 1000 μm. Such planar area and the width as described above is preferably applied to a relatively large light-emitting device having a side of 3 mm or more. With the light-absorbing member 3 having a size in a range as described above, when viewed from above the light extraction surface, the influence of reflection of external light can be reduced.

The light-absorbing member 3 has a depth or a thickness that can be appropriately adjusted within a range that allows the influence of reflection of external light to be reduced.

In forming of the package 1, the depressed portion 1c can be formed at the location as described above, in the depressed portion 1c, the light-absorbing member 3 can be disposed using a potting technique and the like. Alternatively, in forming of the package 1, the light-absorbing member using a material different from a material of the resin part 4 may be disposed at an appropriate position, to form the light-absorbing member 3 simultaneously with the package 1.

The light-absorbing member 3 can be made of a material that can absorb light with a wavelength of light emitted from the light-emitting element 2 and/or visible light of a wavelength other than wavelength of light emitted from the light-emitting element 2. For example, the light-absorbing member 3 is preferably made of a resin material containing a light-absorbing substance. Any of resin materials described above as examples of a material of the resin part 4 of the package 1 may be used. Examples of the light-absorbing substance includes a substance having a light absorption coefficient to visible light larger than that of the resin part 4 of the package. More specific examples of the material include pigments, particularly carbon-based pigments such as carbon blacks and graphite.

The light-absorbing member 3 preferably absorbs 70% or more of light emitted from the light-emitting element 2 and/or visible light of a wavelength other than wavelength of light emitted from the light-emitting element 2. More specific examples of the material include epoxy resins containing black pigments such as carbon blacks. The light-absorbing member 3 may contain a light scattering substance and the like as well as the light-absorbing substance. Examples of the light scattering substance include titanium oxide, silicon oxide, zirconium oxide and aluminum oxide. The light-absorbing member 3 preferably contains the light-absorbing substance at, for example, 1 wt % to 20 wt % of the total weight of the light-absorbing member 3.

In FIGS. 1A and 1B, the light-absorbing member 3 is made of an epoxy resin that contains 1 wt % to 15 wt % of carbon blacks. The light-absorbing member 3 is disposed at the outer periphery of the upward-facing surface 1e of the recess 1a on which the light-emitting element is mounted, that is, adjacent to the lateral wall of the recess 1a, and is exposed only at the upward-facing surface so as to have a width of 300 μm and a depth of 600 μm. The light-absorbing member 3 has an upper surface slightly recessed with respect to the upward-facing surface 1e of the recess 1a on which the light-emitting element is mounted. The light-absorbing member 3, for example, has a planar area that is approximately 25% of the plane area of the light-emitting device when viewed from above the light extraction surface.

Sealing Member

The light-emitting device 10 preferably includes a sealing member in the recess 1a on which the light-emitting element 2 is disposed. The sealing member can protect the light-emitting element 2 from external forces, dust, moisture, and the like, and allows for improving heat resistance, weather resistance, light resistance, and the like of the light-emitting element 2.

The sealing member preferably transmits 60% or more, and more preferably 70%, 80% or 90% or more, of light emitted from the light-emitting element 2. Examples of materials for the sealing member include resin materials similar to those described as examples of a material of the resin part 4 of the package 1. In the sealing member, light scattering particles, such as titanium oxide, silicon oxide, zirconium oxide, or aluminum oxide, may be dispersed. Particles of a material that converts the wavelength of light emitted from the light-emitting element 2, such as a phosphor, may also be dispersed in the sealing member. Specific examples of the phosphor include yttrium-aluminum-garnet activated by cerium, lutetium-aluminum-garnet activated by cerium, nitrogen-containing calcium aluminosilicate (calcium may be partially substituted with strontium) activated by europium and/or chromium, SiAlON activated by europium, silicate activated by europium, strontium aluminate activated by europium, and potassium fluorosilicate activated by manganese.

The sealing member may preferably contain the light scattering particles and/or the phosphor, for example, at 10 to 90 wt % of the total weight of the sealing member.

The upper surface of the sealing member may have a recessed shape or a protruded shape.

Second Embodiment

Figure 2A:
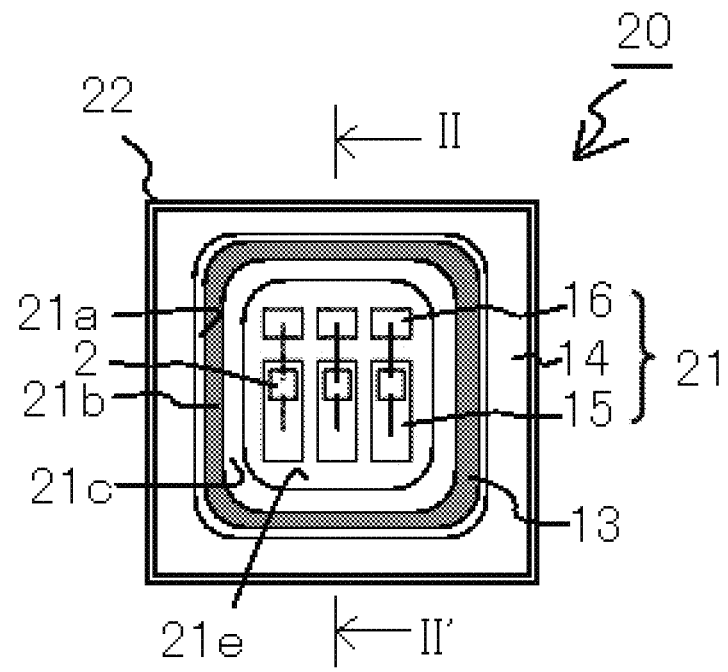
FIG. 2A is a schematic plan view of a light-emitting device according to another embodiment of the present disclosure.
Figure 2B:
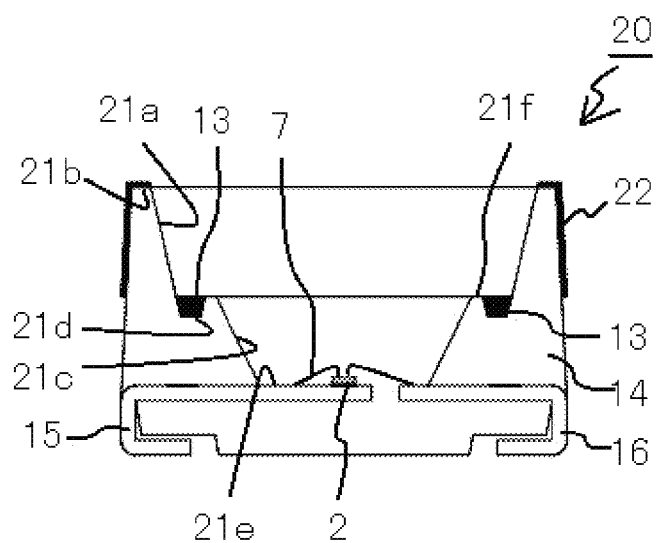
FIG. 2B is a schematic sectional view taken along the line II-II' in FIG. 2A.

As shown in FIGS. 2A and 2B, a light-emitting device 20 according to a second embodiment of the present disclosure includes a package 21 defining a recess 21a having an opening at a light extraction surface, a light-emitting element 2 mounted on an upward-facing surface 21e defining the recess 21a, a light-absorbing member 13 disposed in the recess 21a, spaced apart from the light-emitting element 2, and having an exposed surface facing upward toward the light extraction surface.

With this configuration, as described above, in the case where, for example, the light-emitting device is used for a display device, the light-emitting device is unlikely to be influenced by reflection of external tight when viewed from above the light extraction surface.

In the light-emitting device 20, the package 21 defines the recess 21a having a width increased toward the upper surface 21b of the package 21. The recess 21a has the opening at the light extraction surface, which is an upper surface 21b of the package 21. The recess 21a includes a step portion 21f disposed between the opening and the upward-facing surface 21e and parallel to the upper surface 21b, and is formed by a second lateral surface 21c between the step portion 21f and the upward-facing surface 21e. The upward-facing surface 21e is formed substantially parallel to the upper surface 21b. Three pairs of lead electrodes 15 and 16 are exposed at the upward-facing surface 21e. A total of three light-emitting elements are disposed on the three lead electrodes 15 such that each of the three light-emitting elements is disposed on a respective one of the three lead electrodes 15.

At the step portion 21f, a depressed portion 21d spaced apart from the upward-facing surface 21e and the second lateral surface 21c and adjacent to the lateral wall of the recess 21a is formed. The light-absorbing member 13 is disposed only in the depressed portion 21d. For example, the exposed surface of the light-absorbing member 13 has a width of 500 µm. For example, the depressed portion 21d has a depth of 300 µm. The light-absorbing member 13 has the exposed surface facing upward toward the light extraction surface at the step portion 21f that is parallel to the upward-facing surface 21e. This structure allows for preventing primary light emitted from the light-emitting element 2 from being directly incident the light-absorbing member 13. Thus, the reduction of the light extraction efficiency can be greatly reduced.

Light-Absorbing Film 22

The package 21 preferably includes a light-absorbing film 22 disposed on a part of the light extraction surface and/or on a portion of each of outer lateral surfaces of the package 21. The light-absorbing film 22 may be applied to the package 1 of the first embodiment shown in FIGS. 1A and 1B in the same manner as the light-absorbing film 22 shown in FIGS. 2A and 2B. More specifically, in FIGS. 2A and 2B, the light-absorbing film 22 covers the package 21 over the upper surface 21b and the outer lateral surfaces. The light-absorbing film 22 can be made of a material described above as an example of a material contained in the light-absorbing member. The light-absorbing film 22 is, for example, formed on the upper surface 21b and the outer lateral surfaces of the package 21 by using a known method such as coating by roller, printing such as screen printing or transfer printing, spraying, or dipping. The light-absorbing film 22 is preferably disposed so as to cover an entirety of the upper surface 21b except for the opening of the package 21. The light-absorbing film covers at least a portion of each of the outer lateral surfaces of the package 21 on the upper surface 21b side, and may cover an entirety of the outer lateral surfaces of the package 21. For example, the light-absorbing film may cover the outer lateral surfaces up to a position in a range of approximately one third to four fifth of the height of the package 1 from the upper surface 21b.

In FIGS. 2A and 2B, for example, when viewed from above the light extraction surface, the light-absorbing member 13 and the light-absorbing film 22 has a planar area that is approximately 25% of the entire plane area of the light-emitting device 20.

As described above, with the light-absorbing film 22 covering the upper surface 21b of the package 21 and at least a portion of the outer lateral surface on the upper surface 21b side, reflection of the external light can be further reduced, leading to further improvement of contrast throughout the field of view.

Also, with the step portion at the recess of the package 21, a distance between the upper surface 21b of the package 21 to the upward-facing surface of the package 21 can be increased, so that a boundary distance between the material constituting the package and the material sealing the light-emitting element can be increased, allowing in effectively preventing detachment between these materials.

The light-emitting device according to the present disclosure can be used as light source in various applications, and in particular, is suitably used for a light-emitting device required to provide high luminance, such as a backlight unit, a lighting device, or lighting for vehicles.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light-emitting device comprising:
 a package defining a recess having an opening at a light extraction surface of the package, a part of the recess being defined by an upward-facing surface of the package;
 at least one light-emitting element mounted on the upward-facing surface of the package;
 a light-absorbing member disposed in the recess, spaced apart from the light-emitting element, and having an exposed surface facing upward toward the light extraction surface, the exposed surface being exposed from the upward-facing surface of the package with the exposed surface and the upward-facing surface of the package being on the same plane; and
 a sealing member disposed in the recess and covering at least a lateral surface of the at least one light-emitting element and the exposed surface of the light-absorbing member.

2. The light-emitting device according to claim 1, wherein the exposed surface of the light-absorbing member is recessed with respect to the upward-facing surface defining the recess.

3. The light-emitting device according to claim 1, wherein the package includes a resin part and a plurality of leads exposed from the resin part at the upward-facing surface in the recess, and
 the plurality of leads includes at least one bent portion at least partially covered by the resin part in the package.

4. The light-emitting device according to claim 1, further comprising
 a light-absorbing film on a portion of the light extraction surface of the package and on a portion of each of outer lateral surfaces of the package on a light extraction surface side.

5. The light-emitting device according to claim 1, wherein the light-absorbing member contains black pigments.

6. The light-emitting device according to claim 1, wherein the light-absorbing member is disposed in the recess such that the light-absorbing member surrounds an outer periphery of the light-emitting element in a plan view.

7. The light-emitting device according to claim 1, wherein the upward-facing surface of the package on which the at least one light-emitting element is mounted is not on the same plane as a surface of the package on which the light-absorbing member is mounted.

8. The light-emitting device according to claim 1, wherein the package defines a step portion or a groove arranged within the recess at a position adjacent to a lateral wall defining the recess.

9. The light-emitting device according to claim 1, wherein the light-absorbing member has a planar area of 15% to 50% of a total planar area of the light-emitting device when viewed from the light extraction surface.

10. The light-emitting device according to claim 1, wherein
 a width of the exposed surface of the light-absorbing member is in a range of 150 µm to 1000 µm.

11. The light-emitting device according to claim 1, wherein
 the exposed surface of the light-absorbing member extends substantially parallel to an upper surface or a bottom surface of the package.

12. A light-emitting device comprising:
 a package defining a recess having an opening at a light extraction surface, a part of the recess being defined by an upward-facing surface of the package;

at least one light-emitting element mounted on the upward-facing surface of the package; and a light-absorbing member disposed in the recess, spaced apart from the light-emitting element, and having an exposed surface facing upward toward the light extraction surface, the exposed surface being recessed with respect to the upward-facing surface of the package.

13. The light-emitting device according to claim 12, wherein the package includes a resin part and a plurality of leads exposed from the resin part at the upward-facing surface in the recess, and each of the plurality of leads has a bent portion at least partially covered by the resin part in the package.

14. The light-emitting device according to claim 12, further comprising a light-absorbing film on a portion of the light extraction surface of the package and on a portion of each of outer lateral surfaces of the package on a light extraction surface side.

15. The light-emitting device according to claim 12, wherein the light-absorbing member includes black pigments.

16. The light-emitting device according to claim 12, wherein the light-absorbing member is disposed in the recess such that the light-absorbing member surrounds an outer periphery of the light-emitting element in a plan view.

17. A light-emitting device comprising:

a package defining a recess having an opening at a light extraction surface of the package, the recess being defined by an upward-facing surface and a lateral wall, with the lateral wall including a step portion and/or a groove between the opening and the upward-facing surface;

at least one light-emitting element mounted on the upward-facing surface of the package; and a light-absorbing member disposed in the recess on the step portion and/or in the groove defined by the lateral wall, the light-absorbing member being spaced apart from the light-emitting element, and having an exposed surface exposed from the package.

18. The light-emitting device according to claim 17, further comprising a light-absorbing film on a portion of the light extraction surface of the package and on a portion of each of outer lateral surfaces of the package on a light extraction surface side.

19. The light-emitting device according to claim 17, wherein the light-absorbing member includes black pigments.

20. The light-emitting device according to claim 17, wherein the light-absorbing member is disposed in the recess such that the light-absorbing member surrounds an outer periphery of the light-emitting element in a plan view.

* * * * *